United States Patent
Tan et al.

(10) Patent No.: US 12,273,072 B2
(45) Date of Patent: Apr. 8, 2025

(54) ENVELOPE DETECTOR WITH CLAMPING CIRCUITRY

(71) Applicant: QUALCOMM Incorporated, San Diego, CA (US)

(72) Inventors: Cheng Tan, Denver, CO (US); Bruce Charles Fischer, Jr., Lafayette, CO (US); Brian French, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 593 days.

(21) Appl. No.: 17/646,405

(22) Filed: Dec. 29, 2021

(65) Prior Publication Data
US 2023/0208362 A1    Jun. 29, 2023

(51) Int. Cl.
*H03F 1/02*   (2006.01)
*H03F 3/19*   (2006.01)
*H04B 1/40*   (2015.01)

(52) U.S. Cl.
CPC ............. *H03F 1/0233* (2013.01); *H03F 3/19* (2013.01); *H03F 2200/105* (2013.01); *H03F 2200/451* (2013.01); *H04B 1/40* (2013.01)

(58) Field of Classification Search
CPC .... H03F 1/0233; H03F 3/19; H03F 2200/105; H03F 2200/451; H03F 2200/99; H03F 1/0255; H04B 1/40; H03G 11/02; G01R 19/04; H03D 1/10
USPC ................................ 330/136, 291, 296, 129
See application file for complete search history.

(56) References Cited

U.S. PATENT DOCUMENTS

| | | | |
|---|---|---|---|
| 6,265,940 B1 | 7/2001 | Adachi | |
| 7,190,935 B2 * | 3/2007 | Hecht | H03G 3/3042 |
| | | | 455/425 |
| 8,217,717 B1 | 7/2012 | Bui et al. | |
| 2022/0278659 A1 * | 9/2022 | Zhao | H03F 3/195 |

FOREIGN PATENT DOCUMENTS

CN          210469282 U       5/2020

OTHER PUBLICATIONS

Ducu Dragos: "An1353—Op Amp Rectifiers, Peak Detectors and Clamps", Microchip Technology Inc, Mar. 1, 2011, XP055279782, pp. 1-16, col. 8, Lines 6-23, Figure 2.
International Search Report and Written Opinion—PCT/US2022/081193—ISA/EPO—Apr. 19, 2023.
Knight D.W., "Diode Detectors for RF Measurement Part 1: Rectifier Circuits, Theory and Calculation Procedures", Jan. 1, 2016, XP055671096, pp. 1-116, col. 2, lines 52-64, figure 1.

* cited by examiner

*Primary Examiner* — Andrea Lindgren Baltzell
*Assistant Examiner* — Khiem D Nguyen
(74) *Attorney, Agent, or Firm* — Patterson & Sheridan, L.L.P.

(57) ABSTRACT

An envelope detection circuit and methods for detecting an envelope of a signal using such an envelope detection circuit. One example envelope detection circuit generally includes a first diode, a capacitive element, and a clamping circuit. The first diode has an anode coupled to an input node of the envelope detection circuit and has a cathode coupled to an output node of the envelope detection circuit. The capacitive element is coupled in shunt between the output node and a reference potential node, and the clamping circuit is coupled in shunt between the input node and the reference potential node. The clamping circuit generally includes a resistive element coupled in series with a second diode.

15 Claims, 6 Drawing Sheets

ENVELOPE DETECTOR WITH CLAMPING CIRCUITRY

TECHNICAL FIELD

Certain aspects of the present disclosure generally relate to electronic circuits and, more particularly, to techniques and apparatus for envelope detection.

BACKGROUND

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division, orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, complex and dynamic environments can still attenuate or block signals between wireless transmitters and wireless receivers, undermining various established wireless channel measuring and reporting mechanisms, which are used to manage and optimize the use of finite wireless channel resources. Consequently, there exists a need for further improvements in wireless communications systems to overcome various challenges.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to envelope detection circuitry and to mitigating reliability issues and diode burnout in an envelope detector operating at high power.

Certain aspects of the present disclosure provide an envelope detection circuit. The envelope detection circuit generally includes a first diode having an anode coupled to an input node of the envelope detection circuit and having a cathode coupled to an output node of the envelope detection circuit, a first capacitive element coupled in shunt between the output node and a reference potential node, and a clamping circuit coupled in shunt between the input node and the reference potential node, wherein the clamping circuit comprises a first resistive element coupled in series with a second diode.

Certain aspects of the present disclosure provide a method for envelope detection. The method generally involves detecting an envelope of a signal using a first diode and a first capacitive element coupled in shunt to a cathode of the first diode; and clamping the signal using a clamping circuit comprising a first resistive element coupled in series with a second diode.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
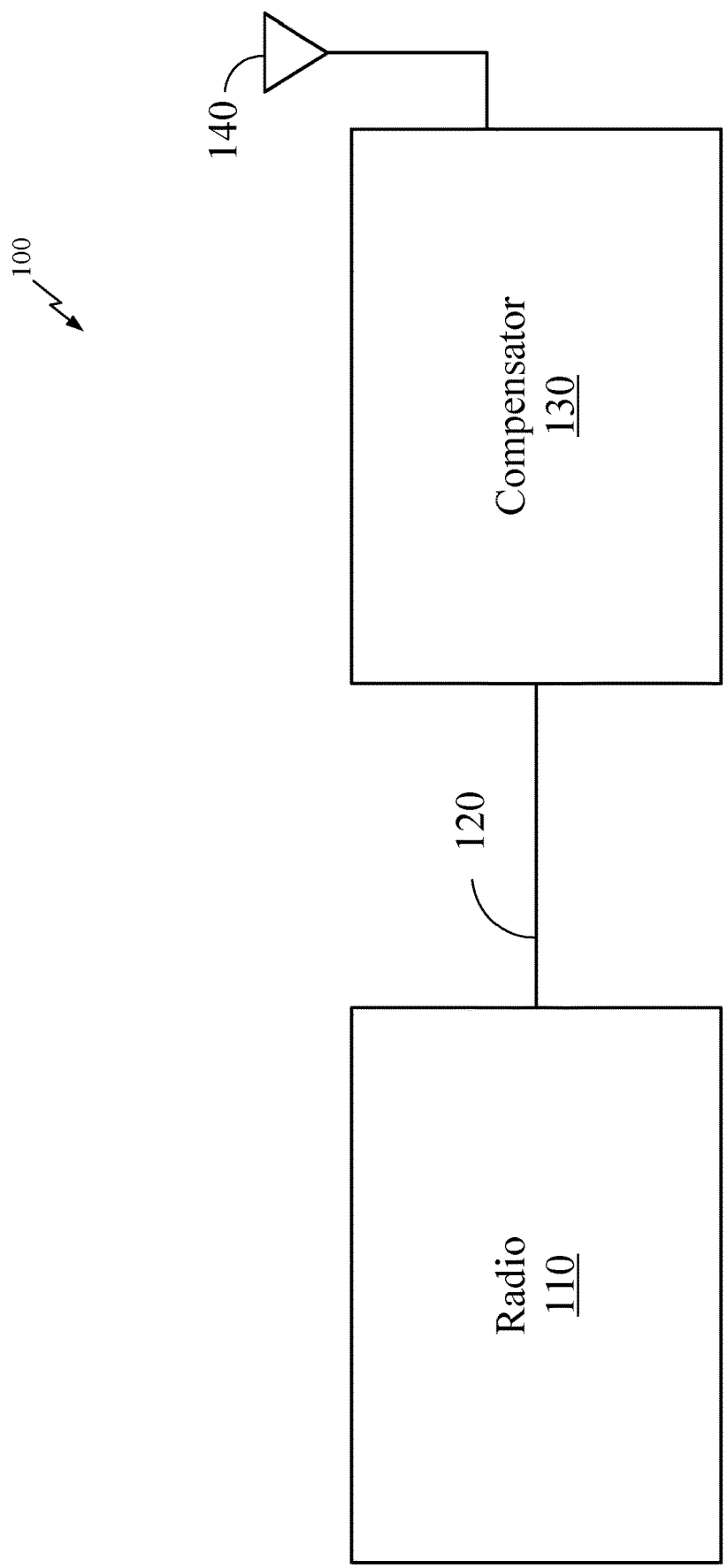
FIG. 1 is a block diagram of an example communication system, in which aspects of the present disclosure may be practiced.

A compensator is a component that improves an undesirable frequency response in a feedback and control system. The most common types of compensators are lead, lag, and lag-lead compensators. A lag-lead compensator is an electrical circuit that produces phase lag at one frequency region and phase lead at another frequency region. Compensators may be used to cancel out (or at least reduce) cable loss when transmitting or receiving signals. Ideally, the transmit power leaving a cable at one end should match the transmit power going into the cable at the other end.

Some compensators may include an envelope detector to detect the envelope of an input signal and provide an output proportional to the amplitude of the envelope of the signal. An envelope detector may be implemented by a diode detector, which may include a forward-biased diode connected between the input and output of the detector and a capacitor connected in shunt to the output of the detector.

The diode generally serves to enhance one-half of the received signal over the other. In many instances Schottky diodes are used for this form of detector, because signal levels may be low, and Schottky diodes have a much lower forward voltage (typically around 0.2 V) than standard silicon diodes (typically around 0.6 or 0.7 V).

Unfortunately, diodes may experience reliability issues when the envelope detector is used to detect high power. For example, it may be desirable to detect a range of power from −11 dBm to +26 dBm. However, the diode may experience burnout at +15 dBm. Accordingly, a need exists for techniques to improve the longevity of envelope detector diodes while the envelope detector operates at high power levels.

Certain aspects of the present disclosure provide clamping circuitry between an input of an envelope detector and an envelope detector diode. The clamping circuitry prevents high power at the input from reaching the envelope detector diode, thereby increasing the longevity and reliability of the envelope detector.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Communication System

FIG. 1 is a block diagram illustrating an example communication system 100, in which aspects of the present disclosure may be practiced. The communication system 100 may include a radio 110, a compensator 130, and an antenna 140 for wireless transmission and/or reception. As illustrated, the output of the radio 110 may be coupled to an input of the compensator 130 by a transmission cable 120, such that the compensator 130 and the antenna 140 may be positioned at a distance remote from the radio 110.

Transmission cables (such as transmission cable 120) may be associated with a cable loss, representing an amount of attenuation (e.g., power loss) caused to a signal sent via these transmission cables. Signals sent using longer transmission cables (e.g., transmission cable 120) may experience greater attenuation than signals sent via shorter transmission cables. For example, when outputting signals for wireless communication via the antenna 140, a power amplifier of the radio 110 may send these signals at a particular transmission power. However, due to lossy characteristics of the transmission cable 120, the transmission power from the power amplifier of the radio 110 to send these signals may be attenuated by the transmission cable 120. This attenuation results in a reduced transmission power seen at the antenna 140, which can lead to these signals not being received by an intended recipient.

To help account for cable loss (e.g., attenuation) associated with the transmission cable 120, the communication system 100 also includes the compensator 130. The compensator 130 is configured to receive the signals from the radio 110 and overall amplify the transmission power associated with these signals such that the attenuation/cable loss of the transmission power associated with the transmission cable 120 is canceled out, or at least reduced. In other words, the compensator 130 may be configured to reproduce the transmission power output by the power amplifier of the radio 110 after the signals output by the radio 110 have traversed the transmission cable 120. This ensures that the signals may be transmitted via the antenna 140 using the proper transmission power. This amplification of the transmission power by the compensator 130 may be accomplished by a gain stage that includes any suitable combination of one or more fixed attenuators, one or more tunable attenuators, one or more fixed amplifiers, and/or one or more tunable amplifiers.

Example Signal Compensator Device

Figure 2:
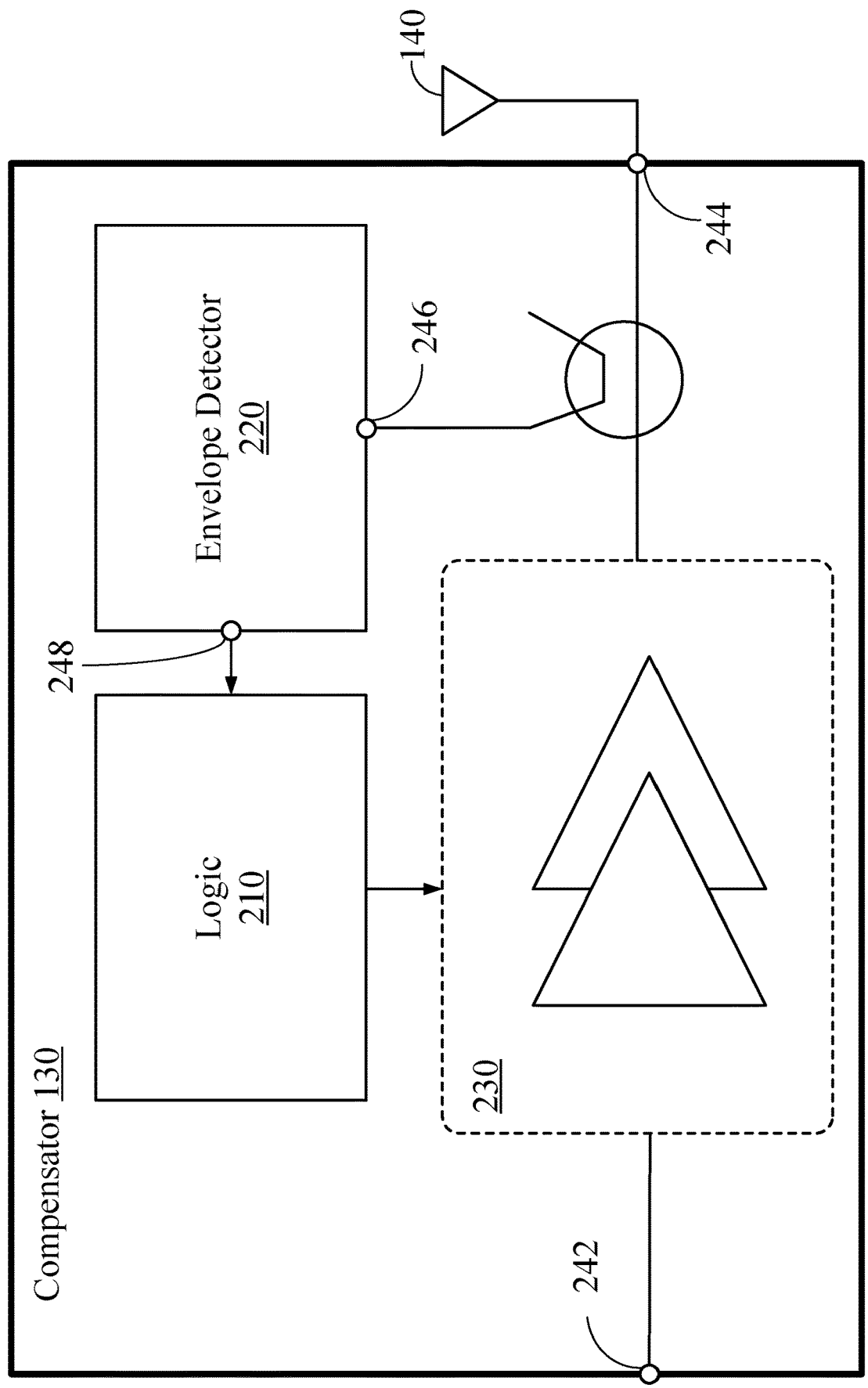
FIG. 2 is a block diagram of an example compensator circuit, in which aspects of the present disclosure may be practiced.

FIG. 2 is a block diagram of an example compensator 130, in which aspects of the present disclosure may be practiced. The compensator 130 may include logic 210, an envelope detector 220, and circuitry 230. For certain aspects, the compensator 130 may be implemented as a small printed circuit board assembly, which may be disposed inside a housing for the antenna 140 and coupled between a cable (e.g., the transmission cable 120 in FIG. 1) and the antenna 140, as shown.

The compensator 130 is designed to cancel out (or at least reduce) cable loss in the transmit and/or receive directions. In the transmit direction, ideally, the transmit power into the antenna 140 should match the transmit power at the output of the radio (e.g., radio 110 in FIG. 1), but the radio does not know the cable loss (which may vary from one type of device to another, depending on the cable length and other cable properties). Therefore, the compensator 130 is designed to measure the cable loss and cancel out (or at least reduce the effects of) this cable loss (referred to as "gain neutral").

To accomplish this, the compensator 130 may measure or estimate the power at the output of the circuitry 230 (e.g., by sampling the current and/or voltage between the circuitry 230 and the antenna 140). The envelope detector 220 may be used to detect the envelope of an input signal and provide an output proportional to the amplitude of the envelope of the signal. Circuitry 230 may include a gain stage, and may generally include a gain stage that includes any suitable combination of one or more fixed attenuators, one or more tunable attenuators, one or more fixed amplifiers, and/or one or more tunable amplifiers. The gain stage may also include switches and/or filters. The output of circuitry 230 in a transmit direction may be coupled to the first port 244.

Additionally or alternatively, in some cases, the circuitry 230 may include at least a portion of a receive path (not shown) for amplifying and filtering received signals from the antenna 140.

The logic 210 may have an input coupled to an output node 248 of the envelope detector 220 and may have an output coupled to a control input of the circuitry 230. The envelope detector 220 may send an indication of the measured power (e.g., of the detected envelope signal) to the logic 210. The logic 210 may compare this indication of the measured power value to an indication of a reference power value, and may output a control signal to adjust the loss (i.e., the attenuation) and/or the gain (i.e., the amplification) of the circuitry 230.

The compensator 130 may include a radio frequency front-end circuit, which may include at least a portion of a transmit path, at least a portion of a receive path, or at least a portion of transceiver front-end. The compensator 130 may include a first port 244 coupled to the antenna 140. The compensator 130 may also include a second port 242. For certain aspects, the second port 242 may be used for coupling the compensator 130 to a cable (e.g., transmission cable 120). For certain aspects, the second port 242 may be coupled to an input of the circuitry 230 (e.g., a gain stage), and the first port 244 may be coupled to an output of the circuitry 230, such as in a transmit direction.

Figure 3:
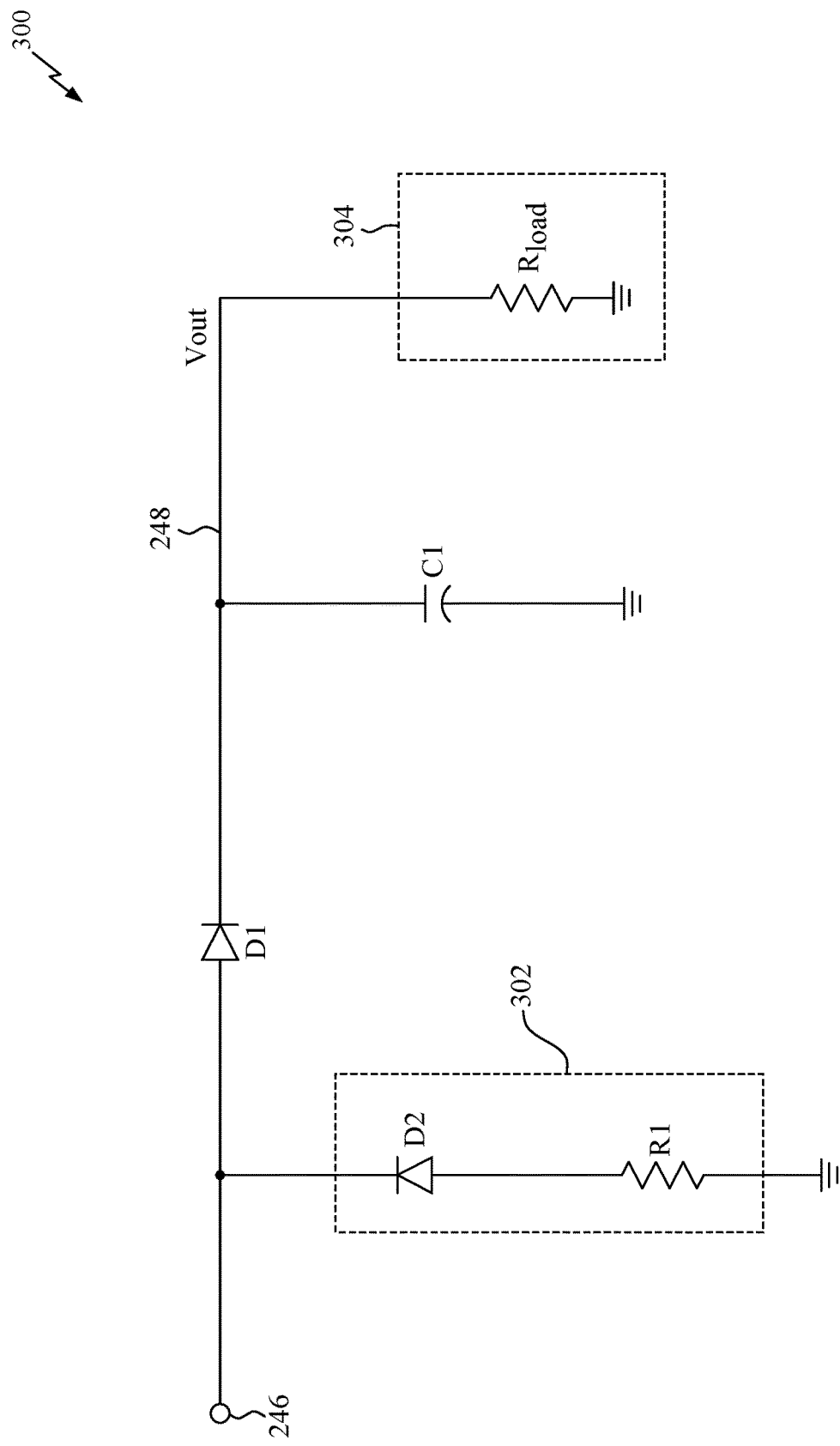
FIG. 3 is a schematic diagram of an example envelope detector with a clamp, in accordance with certain aspects of the present disclosure.

FIG. 3 is a schematic diagram of an example envelope detector 300. The envelope detector 300 of FIG. 3 may serve as the envelope detector 220 of FIG. 2. The envelope detector 300 may include a diode D1 and a capacitive element C1 to perform the main envelope detection function. The diode D1 may have an anode coupled to an input node 246 of the envelope detector 300 and a cathode coupled to an output node 248 (labeled "Vout") of the envelope detector, as shown. The capacitive element C1 may be coupled in shunt between the cathode of the diode D1 and a reference potential node (e.g., electrical ground) for the envelope detector 300. In some cases, the output node 248 of the envelope detector 300 may be coupled to a load impedance 304 (represented, for example, by resistive element Rload in FIG. 3) of the envelope detector.

The envelope detector 300 may also include a clamping circuit 302 coupled in shunt between the anode of diode D1 and the reference potential node. According to certain aspects, the clamping circuit 302 may be implemented by a diode D2 and a resistive element R1 coupled in series, in a shunt path between the anode of diode D1 and the reference potential node. According to certain aspects, the cathode of diode D2 may be coupled to the anode of diode D1, and the anode of diode D2 may be coupled to a terminal of resistive element R1, as shown in FIG. 3. According to certain other aspects, resistive element R1 may be coupled between the anode of diode D1 and the cathode of diode D2. In other words, the positions of resistive element R1 and diode D2 may be interchanged.

In certain aspects, diode D1 and diode D2 may be the same type of diode. For example, diode D1 and diode D2 may both be Schottky diodes, which typically have a lower forward voltage ($V_F$) than standard diodes, as described above. For other aspects, diode D2 may be a different diode type than diode D1.

According to certain aspects, resistive element R1 may have a resistance of about 15 ohms. This resistance may be selected as a tradeoff between power loss and burnout protection.

Figure 4:
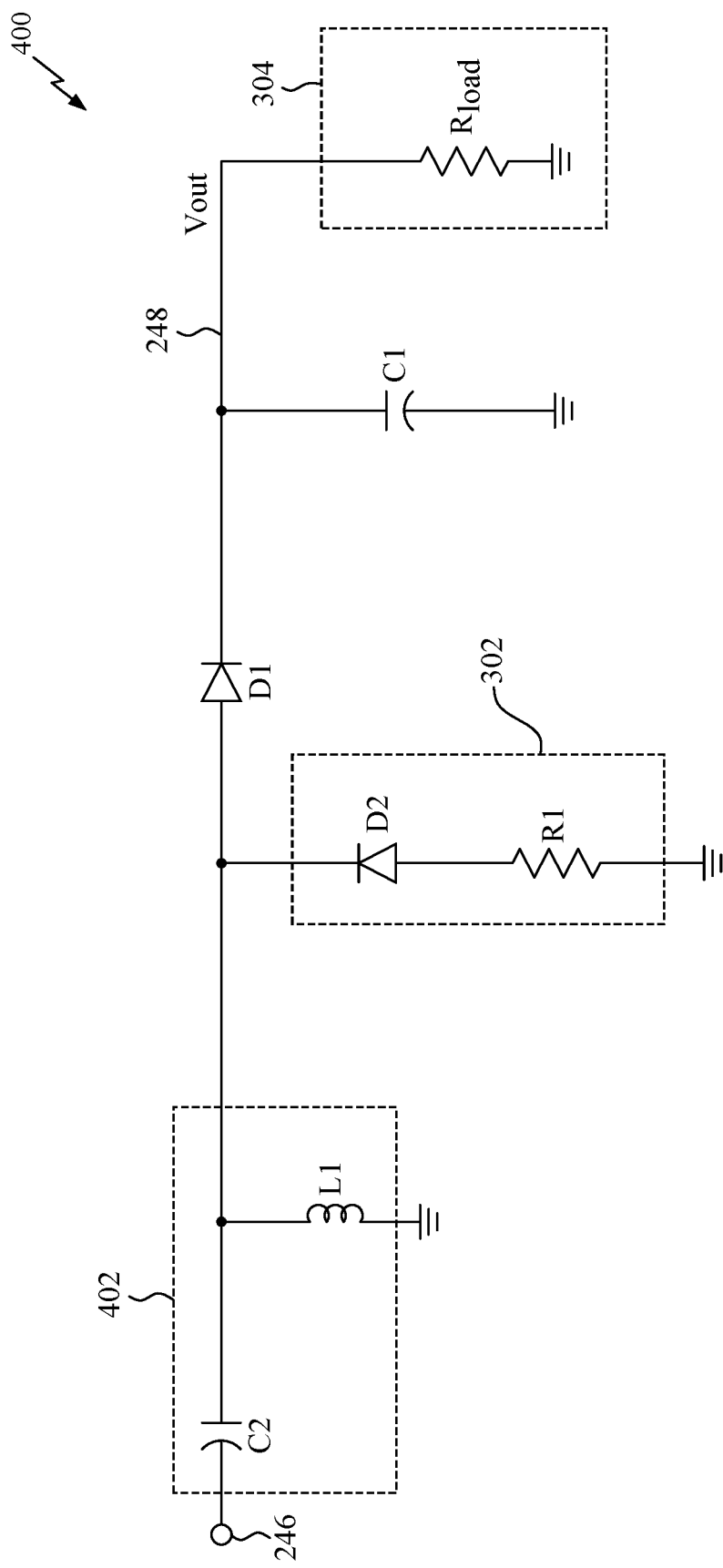
FIG. 4 is a schematic diagram of an example impedance-matched envelope detector with a clamp, in accordance with certain aspects of the present disclosure.

FIG. 4 is a schematic diagram of an example impedance-matched envelope detector 400. The envelope detector 400 of FIG. 4 is similar to the envelope detector 300 of FIG. 3, but includes an impedance matching circuit 402 coupled between the input node 246 of the envelope detector and the anode of the diode D1. The impedance matching circuit 402 may be implemented by any of various suitable topologies for matching a source impedance of an external component (e.g., the antenna 140) to an input impedance of the envelope detector. For example, the impedance matching circuit 402 may include a capacitive element C2 coupled in series between the input node 246 of the envelope detector and the anode of the diode D1. The impedance matching circuit 402 may also include an inductive element L1 coupled in shunt between the anode of diode D1 and the reference potential node. The capacitance of capacitive element C2 and the inductance of inductive element may be selected for maximum power transfer between the external component and the envelope detector.

Figure 5:
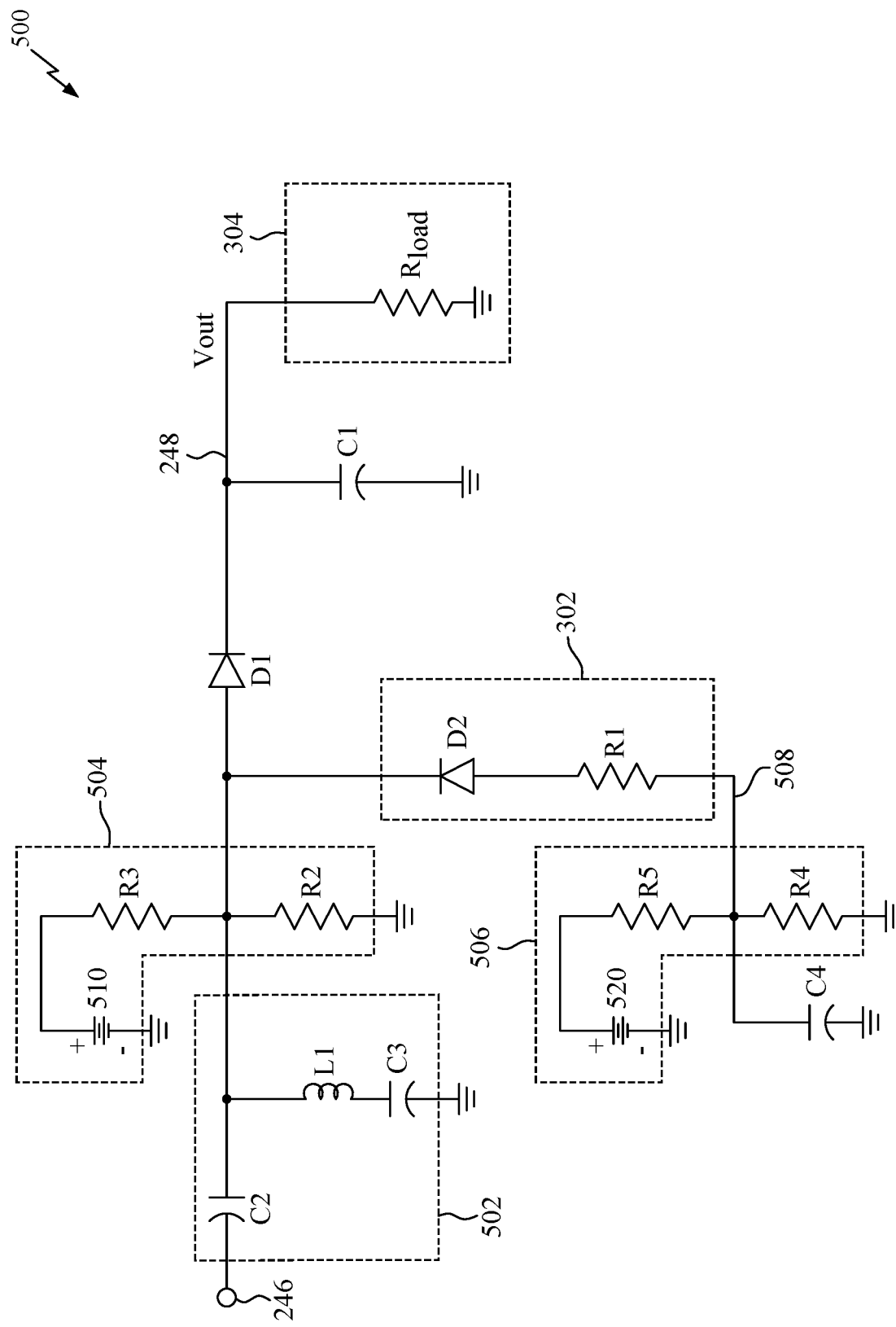
FIG. 5 is a schematic diagram of an example DC-biased and impedance-matched envelope detector with a clamp, in accordance with certain aspects of the present disclosure.

FIG. 5 is a schematic diagram of an example DC-biased and impedance-matched envelope detector 500. The envelope detector 500 of FIG. 5 is similar to the envelope detector 400 of FIG. 4, but also includes DC bias circuitry. In particular, the envelope detector 500 may include a first DC bias circuit 504 coupled to the anode of the diode D1 and a second DC bias circuit 506 coupled to the clamping circuit 302 (e.g., diode D2 and resistive element R1).

The anode of diode D1 may be biased using a first DC power source 510 in the first DC bias circuit 504. The first DC bias circuit 504 may also include a second resistive element R2 coupled in shunt between the anode of the diode D1 and the reference potential node, as well as a third resistive element R3 coupled between the anode of the diode D1 and a first DC bias node (e.g., a terminal of DC power source 510). According to certain aspects, an impedance matching circuit 502 may be coupled between the input node 246 of the envelope detector and the anode of the diode D1, similar to the impedance matching circuit 402 of FIG. 4. In addition to the capacitive element C2 and inductive element L1, the impedance matching circuit 502 also includes a third capacitive element C3 coupled in series between the inductive element L1 and the reference potential node, such that the inductive element L1 does not act as a short to ground for the DC bias voltage. For certain aspects, the third capacitive element C3 may comprise a large value bulk capacitor. The impedance matching circuit 502 may be implemented by any of various other suitable topologies.

The envelope detector 500 may also include a fourth capacitive element C4 coupled between the clamping circuit 302 and the reference potential node. For certain aspects, the capacitance of the fourth capacitive element C4 may match the capacitance of the third capacitive element C3. In some cases, the fourth capacitive element C4 may comprise a large value bulk capacitor. The clamping circuit 302 may be biased using a second DC power source 520 in the second DC bias circuit 506. The second DC power source 520 may have the same DC voltage as the first DC power source 510, and in some cases, the first and second DC power sources may be the same DC power source. The second DC bias circuit 506 may also include a fourth resistive element R4 coupled in parallel with the fourth capacitive element C4, as well as a fifth resistive element R5 coupled between a second DC bias node (e.g., a terminal of DC power source 520) and a node 508 coupled to the fourth capacitive element C4, the fourth resistive element R4, and the clamping circuit 302.

According to certain aspects, the second DC bias circuit 506 may have the same components and topology as the first DC bias circuit 504, as shown in FIG. 5. For certain aspects, the first DC bias node and the second DC bias node (e.g., terminals of DC power sources 510 and 520) are configured to provide the same DC bias voltage. According to certain aspects, the ratio of the resistance of resistive element R3 to the resistance of resistive element R2 may be the same as the ratio of the resistance of resistive element R5 to the resistance of the resistive element R4.

Example Operations for Envelope Detection

Figure 6:
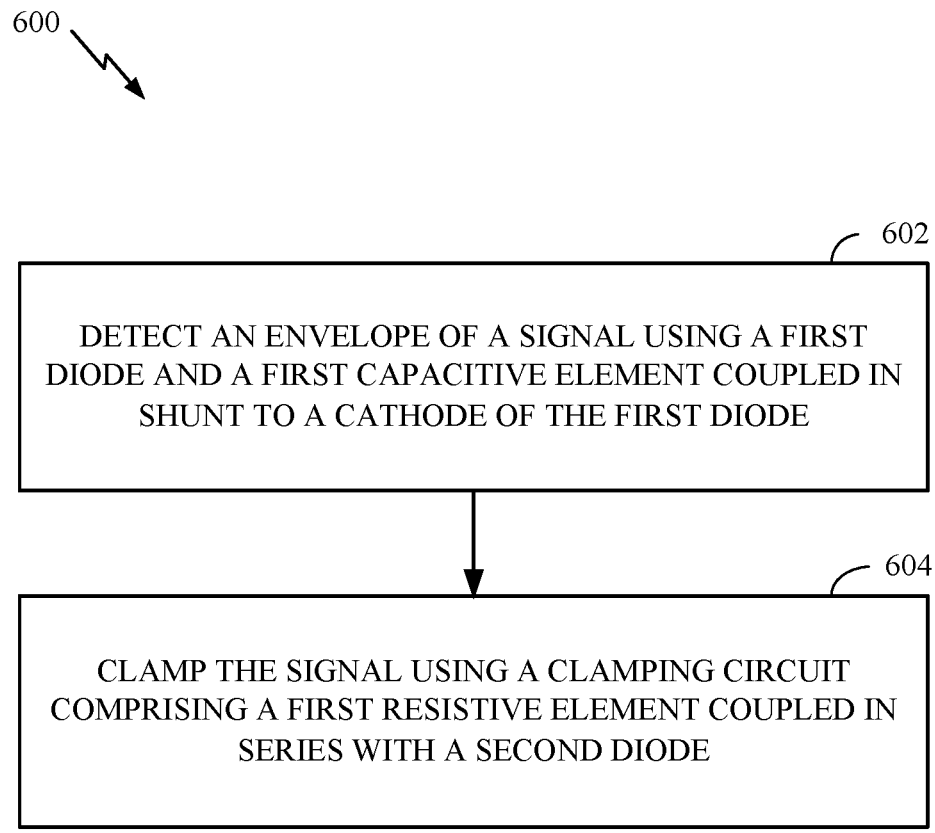
FIG. 6 is a flow diagram of example operations for envelope detection, in accordance with certain aspects of the present disclosure.

FIG. 6 is a flow diagram of example operations 600 for envelope detection, in accordance with certain aspects of the present disclosure. The operations 600 may be performed by an envelope detection circuit, such as the envelope detectors 220, 300, 400, and 500 of FIGS. 2-5.

The operations 600 may begin, at block 602, with the envelope detector detecting an envelope of a signal using a first diode (e.g., diode D1) and a first capacitive element (e.g., capacitive element C1) coupled in shunt to a cathode of the first diode. At block 604, the envelope detector may clamp the signal using a clamping circuit. The clamping circuit may generally include a first resistive element (e.g., resistive element R1) coupled in series with a second diode (e.g., diode D2).

According to certain aspects, a first terminal of the first resistive element may be coupled to a cathode of the second diode and a second terminal of the first resistive element may be coupled to an anode of the first diode. For other aspects, the second diode has an anode coupled to the first resistive element and has a cathode coupled to the anode of the first diode According to certain aspects, the operations 600 may further involve transforming an impedance using an impedance matching circuit (e.g., impedance matching circuit 402 or 502) coupled to an anode of the first diode. For certain aspects, the impedance matching circuit may include a second capacitive element (e.g., capacitive element C2) coupled in series with the anode of the first diode and an inductive element (e.g., inductive element L1) coupled in shunt to the anode of the first diode.

According to certain aspects, the operations 600 may further involve DC biasing an anode of the first diode using a first DC bias circuit (e.g., the first DC bias circuit 504). For certain aspects, the operations 600 may further involve DC biasing the clamping circuit using a second DC bias circuit (e.g., the second DC bias circuit 506). For certain aspects, the second DC bias circuit may have the same DC bias voltage, the same components, and/or the same topology as the first DC bias circuit.

Example Aspects

In addition to the various aspects described above, specific combinations of aspects are within the scope of the disclosure, some of which are detailed below:

Aspect 1: An envelope detection circuit comprising: a first diode having an anode coupled to an input node of the envelope detection circuit and having a cathode coupled to an output node of the envelope detection circuit; a first capacitive element coupled in shunt between the output node and a reference potential node; and a clamping circuit coupled in shunt between the input node and the reference potential node, wherein the clamping circuit comprises a first resistive element coupled in series with a second diode.

Aspect 2: The envelope detection circuit of Aspect 1, wherein the second diode has an anode coupled to the first resistive element and has a cathode coupled to the anode of the first diode.

Aspect 3: The envelope detection circuit of Aspect 1 or 2, further comprising an impedance matching circuit coupled between the input node of the envelope detection circuit and the anode of the first diode.

Aspect 4: The envelope detection circuit of Aspect 3, wherein the impedance matching circuit comprises: a second capacitive element coupled in series between the input node of the envelope detection circuit and the anode of the first diode; and an inductive element coupled in shunt between the anode of the first diode and the reference potential node.

Aspect 5. The envelope detection circuit of any of the preceding Aspects, further comprising a first DC bias circuit coupled to the anode of the first diode.

Aspect 6: The envelope detection circuit of Aspect 5, wherein the first DC bias circuit comprises: a second resistive element coupled in shunt between the anode of the first diode and the reference potential node; and a third resistive element coupled between the anode of the first diode and a first DC bias node, wherein the impedance matching circuit further comprises a third capacitive element coupled in series between the inductive element and the reference potential node.

Aspect 7: The envelope detection circuit of Aspect 5 or 6, further comprising a second DC bias circuit coupled to the clamping circuit.

Aspect 8: The envelope detection circuit of Aspect 7, wherein the second DC bias circuit has the same components and topology as the first DC bias circuit.

Aspect 9: The envelope detection circuit of Aspect 7 or 8, further comprising a fourth capacitive element coupled between the clamping circuit and the reference potential node, wherein the second DC bias circuit comprises: a fourth resistive element coupled in parallel with the fourth capacitive element; and a fifth resistive element coupled between a second DC bias node and a node coupled to the fourth capacitive element, the fourth resistive element, and the clamping circuit.

Aspect 10: The envelope detection circuit of Aspect 9, wherein the first DC bias node and the second DC bias node are configured to provide the same DC bias voltage.

Aspect 11: The envelope detection circuit of Aspect 9 or 10, wherein a ratio of a resistance of the third resistive element to a resistance of the second resistive element is the same as a ratio of a resistance of the fifth resistive element to a resistance of the fourth resistive element.

Aspect 12: A radio frequency front-end circuit comprising the envelope detection circuit of any of the preceding Aspects, the radio frequency front-end circuit further comprising: a first port for coupling to an antenna; a gain stage comprising at least one of a tunable amplifier or a tunable attenuator, wherein an output of the gain stage is coupled to the first port; and logic having an input coupled to the output node of the envelope detection circuit and having an output coupled to a control input of the at least one of the tunable amplifier or the tunable attenuator.

Aspect 13: The radio frequency front-end circuit of Aspect 12, further comprising a second port for coupling to a cable, wherein the second port is coupled to an input of the gain stage.

Aspect 14: A method for envelope detection, comprising: detecting an envelope of a signal using a first diode and a first capacitive element coupled in shunt to a cathode of the first diode; and clamping the signal using a clamping circuit comprising a first resistive element coupled in series with a second diode.

Aspect 15: The method of Aspect 14, wherein a first terminal of the first resistive element is coupled to a cathode of the second diode and wherein a second terminal of the first resistive element is coupled to an anode of the first diode.

Aspect 16: The method of Aspect 14 or 15, further comprising transforming an impedance using an impedance matching circuit coupled to an anode of the first diode.

Aspect 17: The method of Aspect 16, wherein the impedance matching circuit comprises: a second capacitive element coupled in series with the anode of the first diode; and an inductive element coupled in shunt to the anode of the first diode.

Aspect 18: The method of any of Aspects 14-17, further comprising DC biasing an anode of the first diode using a first DC bias circuit.

Aspect 19: The method of Aspect 18, further comprising DC biasing the clamping circuit using a second DC bias circuit, wherein the second DC bias circuit has the same components and topology as the first DC bias circuit.

ADDITIONAL CONSIDERATIONS

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. An envelope detection circuit comprising:
   a first diode having an anode coupled to an input node of the envelope detection circuit and having a cathode coupled to an output node of the envelope detection circuit;
   a first capacitive element coupled in shunt between the output node and a reference potential node;
   a clamping circuit coupled in shunt between the input node and the reference potential node, wherein the clamping circuit comprises a first resistive element coupled in series with a second diode; and
   an impedance matching circuit coupled between the input node of the envelope detection circuit and the anode of the first diode, wherein the impedance matching circuit comprises:
      a second capacitive element coupled in series between the input node of the envelope detection circuit and the anode of the first diode; and
      an inductive element coupled in shunt between the anode of the first diode and the reference potential node.

2. The envelope detection circuit of claim 1, wherein the second diode has an anode coupled to the first resistive element and has a cathode coupled to the anode of the first diode.

3. The envelope detection circuit of claim 1, further comprising a first DC bias circuit coupled to the anode of the first diode.

4. The envelope detection circuit of claim 3, wherein the first DC bias circuit comprises:
   a second resistive element coupled in shunt between the anode of the first diode and the reference potential node; and
   a third resistive element coupled between the anode of the first diode and a first DC bias node, wherein the impedance matching circuit further comprises a third capacitive element coupled in series between the inductive element and the reference potential node.

5. The envelope detection circuit of claim 4, further comprising a second DC bias circuit coupled to the clamping circuit.

6. The envelope detection circuit of claim 5, wherein the second DC bias circuit has the same components and topology as the first DC bias circuit.

7. The envelope detection circuit of claim 5, further comprising a fourth capacitive element coupled between the clamping circuit and the reference potential node, wherein the second DC bias circuit comprises:
   a fourth resistive element coupled in parallel with the fourth capacitive element; and
   a fifth resistive element coupled between a second DC bias node and a node coupled to the fourth capacitive element, the fourth resistive element, and the clamping circuit.

8. The envelope detection circuit of claim 7, wherein the first DC bias node and the second DC bias node are configured to provide the same DC bias voltage.

9. The envelope detection circuit of claim 7, wherein a ratio of a resistance of the third resistive element to a resistance of the second resistive element is equal to a ratio of a resistance of the fifth resistive element to a resistance of the fourth resistive element.

10. A radio frequency front-end circuit comprising the envelope detection circuit of claim 1, the radio frequency front-end circuit further comprising:
   a first port for coupling to an antenna;
   a gain stage comprising at least one of a tunable amplifier or a tunable attenuator, wherein an output of the gain stage is coupled to the first port; and
   logic having an input coupled to the output node of the envelope detection circuit and having an output coupled to a control input of the at least one of the tunable amplifier or the tunable attenuator.

11. The radio frequency front-end circuit of claim 10, further comprising a second port for coupling to a cable, wherein the second port is coupled to an input of the gain stage.

12. A method for envelope detection, comprising:
- detecting an envelope of a signal using a first diode and a first capacitive element coupled in shunt to a cathode of the first diode;
- clamping the signal using a clamping circuit comprising a first resistive element coupled in series with a second diode; and
- transforming an impedance using an impedance matching circuit coupled to an anode of the first diode, wherein the impedance matching circuit comprises:
  - a second capacitive element coupled in series with the anode of the first diode; and
  - an inductive element coupled in shunt to the anode of the first diode.

13. The method of claim 12, wherein a first terminal of the first resistive element is coupled to a cathode of the second diode and wherein a second terminal of the first resistive element is coupled to the anode of the first diode.

14. The method of claim 12, further comprising DC biasing the anode of the first diode using a DC bias circuit.

15. A method for envelope detection, comprising:
- detecting an envelope of a signal using a first diode and a capacitive element coupled in shunt to a cathode of the first diode;
- clamping the signal using a clamping circuit comprising a resistive element coupled in series with a second diode;
- DC biasing an anode of the first diode using a first DC bias circuit; and
- DC biasing the clamping circuit using a second DC bias circuit, wherein the second DC bias circuit has the same components and topology as the first DC bias circuit.

\* \* \* \* \*